United States Patent [19]
Araki

[11] Patent Number: 5,408,885
[45] Date of Patent: Apr. 25, 1995

[54] PRESSURE DETECTING CIRCUIT FOR SEMICONDUCTOR PRESSURE SENSOR

[75] Inventor: Toru Araki, Itami, Japan

[73] Assignee: Mitsubishi Denki Kabushiki Kaisha, Tokyo, Japan

[21] Appl. No.: 43,536

[22] Filed: Apr. 6, 1993

[30] Foreign Application Priority Data

Apr. 7, 1992 [JP] Japan ................................ 4-85700

[51] Int. Cl.$^6$ ..................... G01L 9/06; G01L 19/04
[52] U.S. Cl. .................................. 73/708; 73/727; 338/4
[58] Field of Search ............... 73/708, 720, 721, 726, 73/727, 753, 754, 746, 734, 862, 623; 338/4, 3

[56] References Cited

U.S. PATENT DOCUMENTS

| | | | |
|---|---|---|---|
| 4,556,807 | 12/1985 | Yamada et al. | 73/708 |
| 4,558,238 | 12/1985 | Yamada et al. | 73/708 |
| 4,883,992 | 11/1989 | Koglin et al. | 307/491 |
| 5,135,002 | 8/1992 | Kirchner et al. | 73/708 |
| 5,146,788 | 9/1992 | Raynes | 73/727 |

FOREIGN PATENT DOCUMENTS

| | | |
|---|---|---|
| 61-230505 | 10/1986 | Japan . |
| 62-210707 | 9/1987 | Japan . |
| 62-221208 | 9/1987 | Japan . |
| 2-073104 | 3/1990 | Japan . |
| 2-306321 | 12/1990 | Japan . |

OTHER PUBLICATIONS

Borky et al, "Integrated Signal Conditioning for Silicon Pressure Sensors", IEEE Transactions on Electron Devices, vol. ED-26, No. 12, Dec. 1979, pp. 1906-1910.

*Primary Examiner*—Donald W. Woodiel
*Attorney, Agent, or Firm*—Leydig, Voit & Mayer

[57] ABSTRACT

A pressure detecting circuit compensating for temperature dependency of a zero point output voltage of a semiconductor pressure sensor. A differential amplifier circuit in a signal processing circuit of the semiconductor pressure sensor includes two transistors. Emitter currents in the two transistors are different in accordance with the temperature dependency of the zero point output voltage of a bridge circuit of a pressure detector. As a result, a difference will arise between the base-emitter voltages of the two transistors. The temperature dependency of the zero point output voltage of the bridge circuit is compensated for by the temperature dependency of the voltage differences of the base-emitter voltages.

5 Claims, 7 Drawing Sheets

PRESSURE DETECTING CIRCUIT FOR SEMICONDUCTOR PRESSURE SENSOR

BACKGROUND OF THE INVENTION

1. Field of the Invention

This invention relates to a pressure detecting circuit for a semiconductor pressure sensor and, more particularly, to compensation for the temperature-dependency of a zero point output voltage of a pressure sensor.

2. Description of the Related Art

Figure 10:
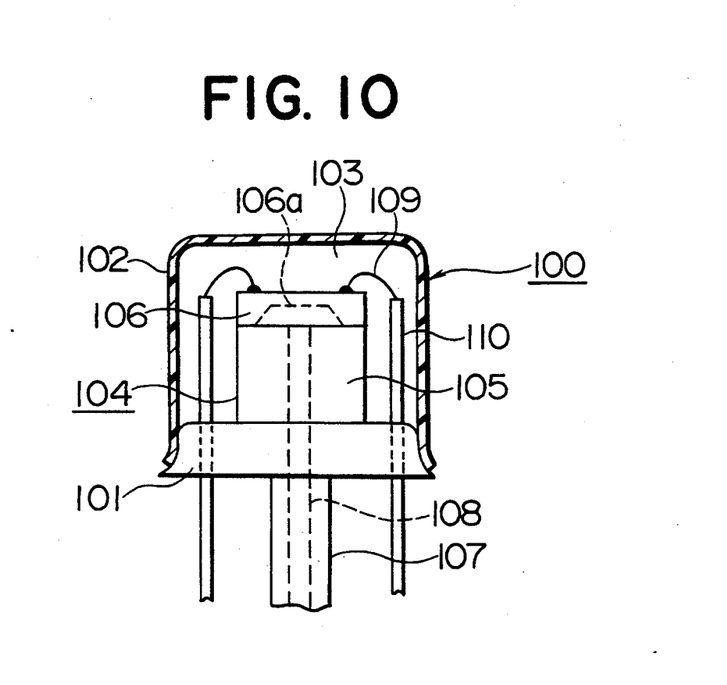
FIG. 10 is a perspective side view showing a semiconductor pressure sensor.

FIG. 10 of the accompanying drawings is a perspective side view showing an overall structure of a semiconductor pressure sensor making use of the pieso-electric effect. In FIG. 10, a semiconductor pressure sensor 100 has a sensor section which is contained in a package formed of a base 101 and a cap 102. A space 103 in the package is a vacuum. The sensor section 104 is composed of a glass base 105 and a semiconductor sensor chip 106 fixed thereto, and secured to the base 101. The central portion of the sensor chip 106 is formed in a thin-plate shape on its lower side. The pressure to be detected is transmitted to the base 101 and the glass base 105 and introduced, by a pressure introductory hole 108 passing through and extending the center thereof, into a space 106a between the glass base 105 and the semiconductor sensor chip 106.

The thin-plate shape portion at the center of the sensor chip 106 deforms in accordance with a pressure difference between the spaces 106a and 103. The distortion generated by the deformation of the central portion of the sensor chip 106 is measured by a pressure detecting circuit located at this central portion, which will be described later, for detecting the pressure. A signal obtained from the pressure detecting circuit is introduced to the outer portion of the package by a lead 110 passing through and extending over the wire 109 and the base 101.

Figure 11:
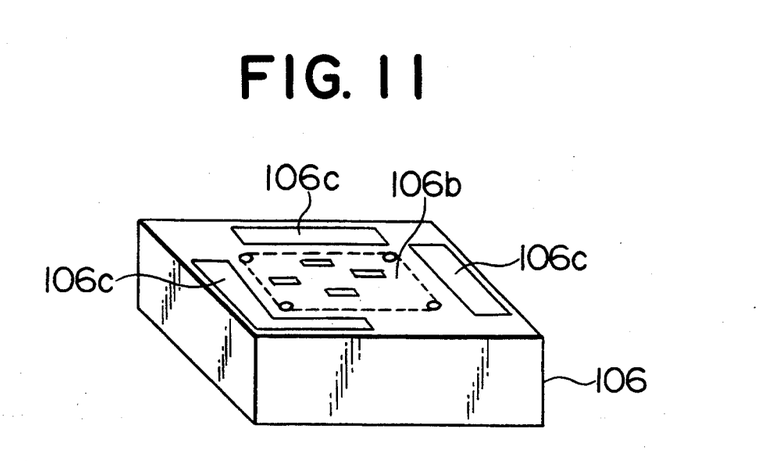
FIG. 11 is a perspective view showing a semiconductor sensor chip of FIG. 10.

FIG. 11 is a perspective view schematically showing a structure of an upper surface of the semiconductor sensor chip 106. A bridge circuit is located at the central portion 106b of the sensor chip 106 for detecting the pressure using the piezoelectric effect. A signal processing circuit is located at a peripheral portion 106c of the bridge circuit. These circuits are formed by using methods such as impurity diffusion etc. on the sensor chip.

Figure 12:
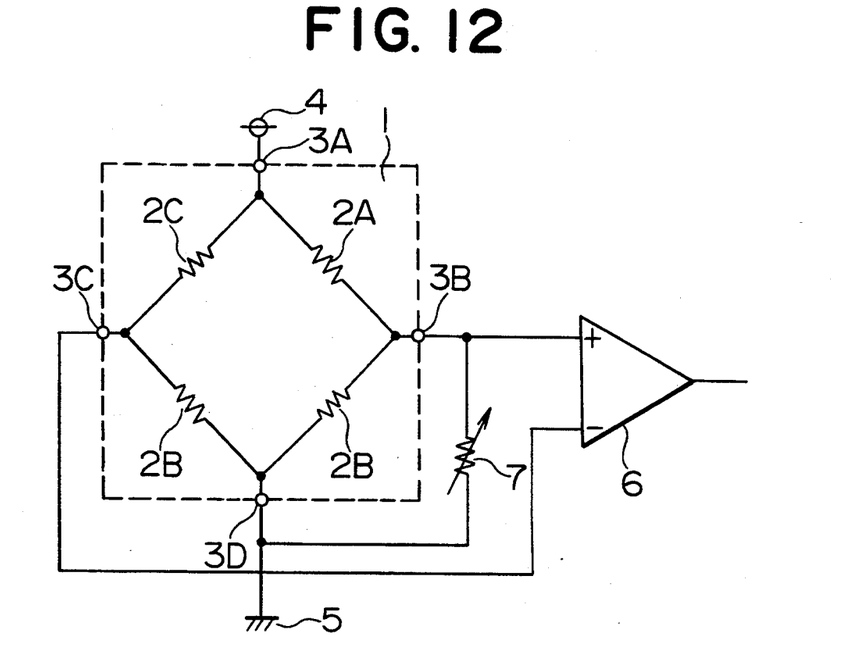
FIG. 12 is a circuit diagram schematically showing a pressure detecting circuit for a conventional semiconductor pressure sensor.

FIG. 12 shows a conventional pressure detecting circuit on the semiconductor sensor chip 106. In FIG. 12, the numeral 1 designates a bridge circuit in contact with a pressure detecting means at the center of the sensor chip. The bridge circuit is connected such that gauge resistors 2A, 2B, 2C and 2D form a Wheatstone bridge circuit. In practice, these gauge resistors 2A, 2B, 2C and 2D are arranged as shown in FIG. 11 to form a rectangle and extend in the same direction. The numerals 3A, 3B, 3C and 3D designate four terminals in the bridge circuit 1, in which the terminal 3A is a connecting point between the gauge resistors 2A and 2C, the terminal 3B is a connecting point between the gauge resistors 2A and 2B, the terminal 3C is a connecting point between the gauge resistors 2C and 2l), and the terminal 3D is a connecting point between the gauge resistors 2B and 2D. The terminal 3A is coupled to a power source 4 while the terminal 3D is coupled to ground 5. The numerals 6 and 7 designate, respectively, a signal processing circuit for amplifying an electric potential generated between the terminals 3B and 3C of the bridge 1 and a resistor coupled between the terminal 3B and 3D and having a low temperature coefficient for temperature compensation.

The operation of the above-mentioned apparatus will now be described. The bridge circuit 1 is composed such that a voltage in accordance with a distortion voltage generated due to the applied pressure arises between the terminals 3B and 3C. Namely, when a distortion is applied to the gauge resistors 2A, 2B, 2C and 2D, their resistance values correspondingly vary. However, since the directions of receiving the distortion are different for contiguous resistors, there would arise a difference in the resistance value. Namely, for some resistors the resistance value would increase while for others it would decrease, so as to cause an imbalance in the bridge circuit 1, thereby generating a voltage.

$$Vod = kf \tag{1}$$

where Vod: difference voltage between the terminals 3B and 3C, f: distortion stress, and k: proportionally constant. According to the equation (1), when the distortion stress is zero, i.e., f = 0, the difference voltage would be Vod=0. In practice, however, Vod≠0. If this is assumed as a zero point output voltage Voffset, tile equation (1) would be represented as follows:

$$Vod = kf + Voffset \tag{2}$$

In general, the correction of Voffset is carried out by applying a corresponding suitable external correction voltage to the signal processing circuit 6. The temperature properties of Vod can be calculated by differentiating the equation (2) with the temperature.

$$\partial Vod/\partial T = \partial kf/\partial T + \partial Voffset/\partial T \tag{3}$$

if f=0, this could be represented as follows:

$$\partial Vod/\partial T = \partial Voffset/\partial T \tag{4}$$

Figure 13:
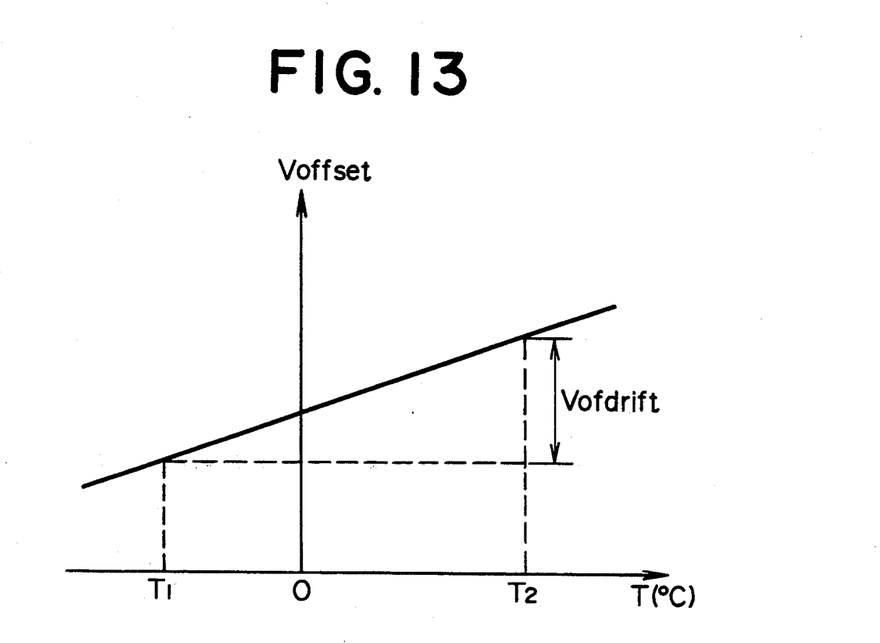
FIG. 13 is a graph showing a relationship between the zero point output voltage and the temperature.

This is the temperature dependency of the zero point output voltage, which is generated by an imbalance of the temperature coefficients of the gauge resistors 2A, 2B, 2C and 2D or a residual stress generated during the assembling operation, in the case of the bridge circuit 1 for detecting the distortion. In general, the temperature dependency can be approximated by a first order function with respect to the temperature:

$$\partial Voffset/\partial T = \alpha \tag{5}$$

where a stands for a proportionality constant. The relationship between the zero point output voltage Voffset and the temperature T is shown in FIG. 13. In FIG. 13, the horizontal axis represents the temperature T while the vertical axis represents a zero point output voltage Voffset. If it is assumed that the available temperature range for the bridge circuit 1 (semiconductor pressure sensor) is T1−T2, this is represented by the following equation:

$$\alpha(T2-T1) = Vofdrift \tag{6}$$

Therefore, the temperature dependency of the zero output voltage in FIG. (6) should be compensated.

When the resistance values of the resistors 2A, 2B, 2C and 2D are represented by RA, RB, RC and RD respectively, and the voltage of the power source 4 is represented by Vr, the potential V3B of the terminal 3B can be expressed as follows:

$$V3B = Vr \times [RB/(RA+RB)] \quad (7)$$

Further, the potential V3C of the terminal 3C can be expressed as follows:

$$V3C = Vr \times [RD/(RC+RD)] \quad (8)$$

Therefore, the output voltage Vod of the bridge circuit 1 can be expressed as follows:

$$Vod = Vr \times \{RB/(RA+RB) - RD/(RC+RD)\} \quad (9)$$

If it is assumed that the temperature coefficients of transistors 2A, 2B, 2C and 2D are the same and designated by character γ, and the resistance value at T=0 is Ro, it is represented as follows:

$$RA = RB = RC = RD = RO\,(\gamma T + 1) \quad (10)$$

For correcting Vofdrift, the resistor 7 is coupled between the terminals 3B and 3D. Namely, when the resistor 7 is coupled in parallel with the resistor RB, the equation (9) can be represented as follows:

$$Vod = Vr\,[(RB//RP)/\{RA+(RB//RP)\} - \tfrac{1}{2}] \quad (11)$$

However, the character Rp designates the resistance value of the resistor 7. If the equation (10) is substituted for the equation (11):

$$Vod = -[Ro(\gamma T+1)/[2Ro(\gamma T+1)+4Rp]] \cdot Vr \quad (12)$$

Here, if Rp >> RB:

$$Vod \doteq -[Ro(\gamma T+1)/4Rp] \cdot Vr \quad (13)$$

The varied amount Vcomp when the range of the temperature T is T1−T2 would be as follows:

$$Vcomp = -(Ro\gamma/4Rp) \cdot Vr\,(T2-T1) \quad (14)$$

Therefore, the Vcomp obtained from the equation (14) would become the correcting amount of the Vofdrift. Namely, the resistance value Rp of the resistor 7 should be determined so as to meet the following condition:

$$Vofdrift + Vcomp = 0 \quad (15)$$

The Rp can be obtained as a unique value by the following equation:

$$Rp = (Ro\gamma Vr/4Vofdrift) \cdot (T2-T1) \quad (16)$$

As mentioned above, for correcting the temperature dependency of the zero point output voltage, the resistor 7 should be inserted between the terminals 3B and 3D. Further, if Vofdrift is negative, the resistor 7 should be inserted between the terminals 3B and 3D, or the terminals 3A and 3B.

Here, attention should be paid to the fact that such a correction cannot be achieved unless the temperature coefficient of the resistor 7 is zero or significantly smaller than the temperature coefficient of the resistors 2A, 2B, 2C and 2D. Further, by inserting the resistor 7, the zero point output voltage would correspondingly vary, but this can be independently corrected by a separate correcting method.

Since the conventional pressure detecting circuit for a semiconductor pressure sensor has been composed as mentioned above, a resistor with quite a small temperature coefficient must be provided for correcting the temperature dependency of the zero point output voltage, which seriously hinders integrating the circuit.

SUMMARY OF THE INVENTION

It is therefore an object of the present invention to provide a pressure detecting circuit for a semiconductor pressure sensor for compensating the temperature dependency of a zero output voltage without using a resistor with small temperature coefficient.

In view of the aforementioned object, the present invention features a pressure detecting circuit for a semiconductor pressure sensor equipped with a circuit for correcting the temperature dependency of a zero point output voltage of a pressure detecting bridge circuit in a signal processing circuit.

According to the pressure detecting circuit for a semiconductor pressure sensor of the present invention, a differential bias current controlling section controls each bias current (being equal in a normal operating state of a operational amplifier) of a pair of transistors of a differentially amplifying section in a signal processing circuit for intentionally unbalancing the circuit to generate an input offset voltage. The temperature dependency of the zero point output voltage of the bridge circuit is corrected by using the temperature dependency of the input offset voltage. The voltage value of the input offset voltage to be generated depends on the difference of the bias current, which is adjusted by a variable resistor, or a D/A converter described later in the description of the embodiments.

The above and other advantages, features and additional objects of this invention will be manifest to those versed in the art upon making reference to the following detailed description and the accompanying drawings in which a structural embodiment incorporating the principles of this invention is shown by way of illustrative example.

DETAILED DESCRIPTION OF THE PREFERRED EMBODIMENT

An embodiment of the present invention will now be described with reference to the accompanying drawings.

Figure 1:
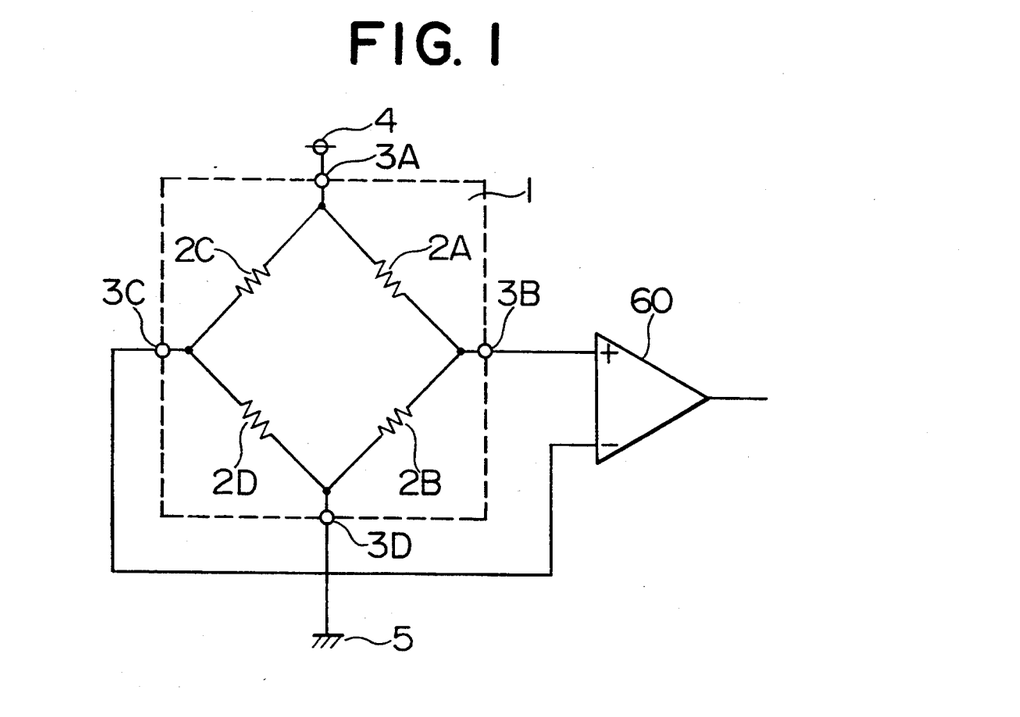
FIG. 1 is a circuit diagram of a pressure detecting circuit for a semiconductor pressure sensor according to an embodiment of the present invention.

FIG. 1 is a circuit diagram showing an embodiment of a pressure detecting circuit for a semiconductor pressure sensor according to the present invention. In FIG. 1, the components that are the same as or correspond to those of the conventional sensor in FIG. 12 are designated by the same numerals or characters. In the pressure detecting circuit in FIG. 1, the correction of the temperature dependency of the zero point output voltage is performed in the signal processing circuit 60, a signal processing means. Therefore, there is no resistor having a low temperature coefficient for correcting the temperature dependency. The circuit shown in FIG. 1 is formed by impurity diffusion and the like methods on a semiconductor sensor chip shown in FIG. 11.

Figure 2:
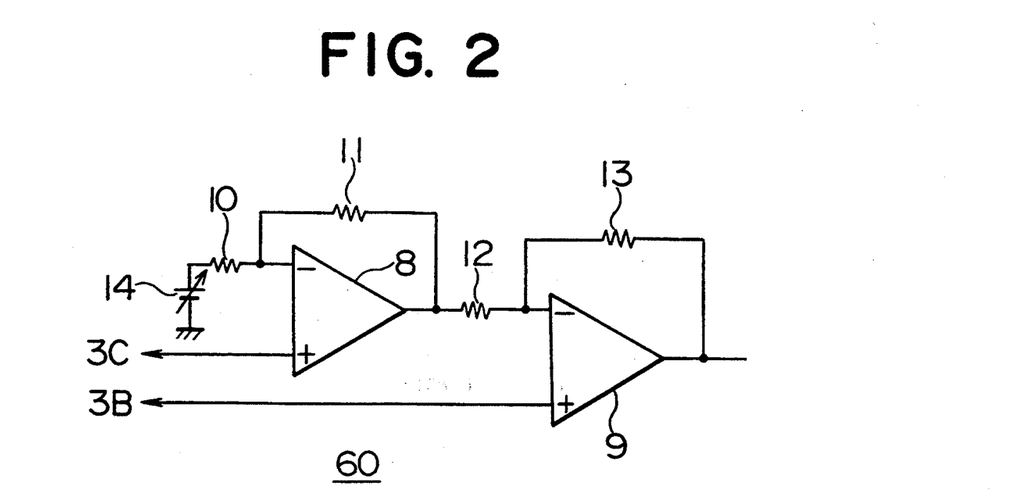
FIG. 2 is a circuit diagram showing an embodiment of the signal processing circuit of FIG. 1.

FIG. 2 is a detailed circuit diagram of the signal processing circuit 60 in FIG. 1. In FIG. 2, the numerals 8 and 9 designate operational amplifiers; 10 and 11 designate resistors for determining the amplification factor of the operational amplifier 8; 12 and 13 designate resistors for determining the amplification factor of the operational amplifier 9; and 14 designates a reference voltage for the signal processing circuit 60.

Figure 3:
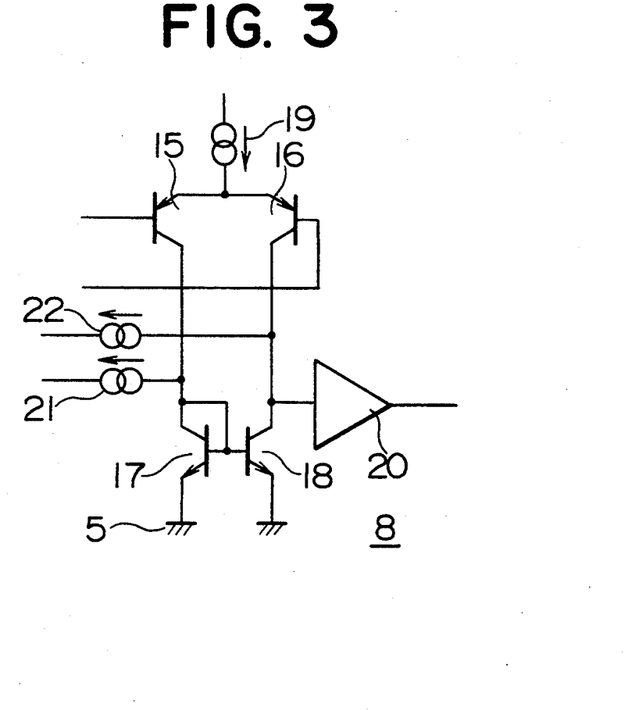
FIG. 3 is a circuit diagram showing an embodiment of parts of the signal processing circuit of FIG. 2.

FIG. 3 is a circuit diagram showing an input section of the operational amplifier 8. In FIG. 3, the numeral 15 designates a PNP transistor having a base connected to a positive input terminal of the operational amplifier 8; 16 is a PNP transistor having a base connected to a negative input terminal of the operational amplifier 8; 17 is an NPN transistor having a collector and a base connected to a collector of the PNP transistor 15; 18 is a NPN transistor having a base connected to a base and a collector of the NPN transistor 17; 19 is a current source for supplying current to emitters of the PNP transistors 15 and 16; 20 is a power amplifier having an input connected to a collector of the NPN transistor 18; 21 is a current source for drawing current from the collector of the NPN transistor 18; and 22 is a current source for drawing a current from the collector of the PNP transistor 16.

The PNP transistors 15 and 16, NPN transistors 17 and 18, and the current source 19 are part of the differentially amplifying section. The power amplifier 20 together with the operational amplifier 9 in FIG. 2 are part of a power amplifying section. The operational amplifier 9 is for providing a differential voltage between the terminal 3B of the bridge circuit 1 a pressure detecting means, and a terminal 3C of the bridge circuit 1 obtained through the operational amplifier 8, and can be a general amplifier so detailed description thereof can be omitted. The voltage sources 21 and 22 are part of a differential bias current controlling section.

Figure 4:
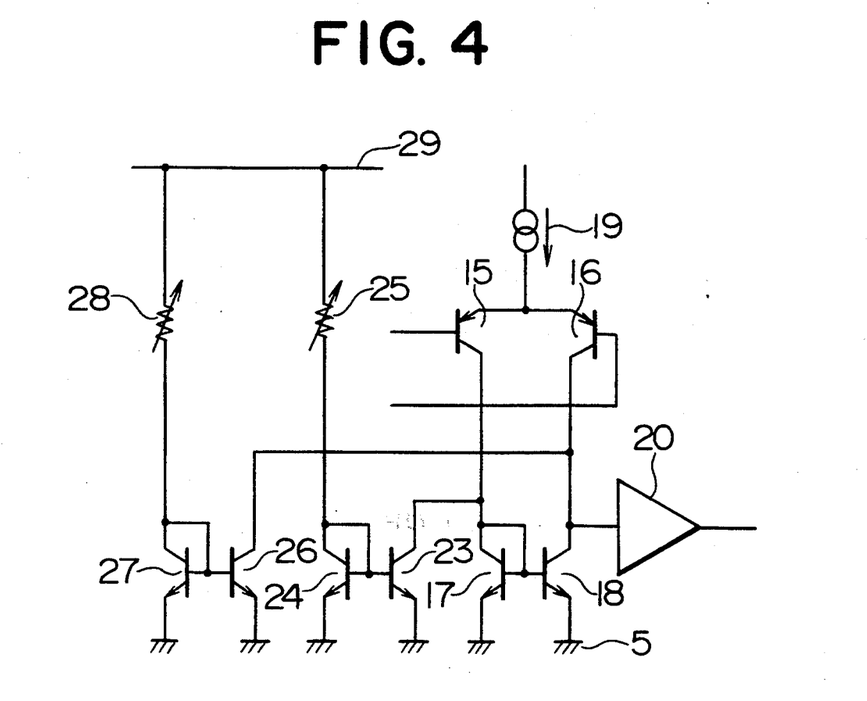
FIG. 4 is a circuit diagram showing a first embodiment particularly of the differential bias current controlling section in FIG. 3.

FIG. 4 is a circuit diagram showing in detail the current sources 21 and 22 forming the differential bias current controlling section in FIG. 3. In FIG. 4, the numeral 23 designates an NPN transistor having a collector coupled to the collector of the PNP transistor, 24 is an NPN transistor having a base and a collector coupled to the base of the NPN transistor 23 is the emitters of the NPN transistors 23 and 24 are coupled in common to the ground 5; and 25, a variable resistor having the end coupled to the base and the collector of the NPN transistor 24.

Further, the numeral 26 is an NPN transistor having a collector coupled to the collector of the PNP transistor 16; 27 is an NPN transistor having a base and a collector coupled to the base of the NPN transistor 26, the emitters of the NPN transistors 26 and 27 being coupled in common to ground 5; 28 is a variable resistor having one end coupled to the base and the collector of the NPN transistor 27; and 29 is a power source to which the other ends of the variable resistors 25 and 28 are coupled.

The circuits aforementioned will now be described in detail. Firstly, the circuit of FIG. 2 is explained. When the voltage of the power source 14 and the output voltage of the operational amplifier 8 are represented respectively as VR1 and Vo1, the following equation is obtained:

$$Vo1 = V3C\{1+(R11/R10)\} - VR1 \cdot (R11/R10) \tag{17}$$

The characters R10 and R11 represent the resistance values of the resistors 10 and 11, respectively. The output voltage Vo of the operational amplifier 9 can be represented as follows:

$$Vo = V3B\{1+(R13/R12)\} - Vo1 \cdot (R13/R12) \tag{18}$$

where R12 and R13 represent the resistance values of the resistors 12 and 13, respectively.

If the equation (17) is substituted in the equation (18), the value Vo can be expressed as follows:

$$Vo = (R13/R12) \cdot (V3B - V3C) + V3B - [\{(R11 \cdot R13)/(R10 \cdot R12)\} \cdot V3C] + [\{(R11 \cdot R13)/(R10 \cdot R12)\} \cdot VR1] \tag{19}$$

If R10=R13 and R11=R12, $$Vo = \{1+(R13/R12)\} \cdot (V3B - V3C) + VR1 \tag{20}$$

Since V3B−V3C=Vod, $$Vo = \{1+(R13/R12)\} \cdot Vod + VR1 \tag{21}$$

Therefore, the output Vod of the bridge circuit is multiplied by $\{1+(R13/R12)\}$ times, and the output to which VR1 is added is output to the opposed grounded terminals. Namely, it would become a single end.

When the bridge circuit 1 is at the zero point, Vod=Voffset. Therefore, the output voltage at this time would be represented as follows:

$$Vo = \{1+(R13/R12)\} Voffset + VR1 \tag{22}$$

When Voffset=0, the relationship Vo=VR10 can be obtained by setting the VR1 as follows:

$$VR1 = VR10 - \{1+(R13/R12)\} Voffset \tag{23}$$

In the case of presenting a positive offset voltage Vof to the operational amplifier 8, the equation (20) would be as follows:

$$Vo = \{1+(R13/R12)\}Vod - \{1+(R13/R12)\}Vof + VR1 \quad (24)$$

If the equation (24) is differentiated by the temperature T, $$\partial Vo/\partial T = \{1+(R13/R12)\}\cdot\{\partial(Vod-Vof)/\partial T\} \quad (25)$$

In the equation (25), since $\partial Vo/\partial T = \partial Voffset/\partial T = \alpha$ at zero point, $$\partial Vo/\partial T = \{1+(R13/R12)\}\{\alpha - (\partial Vof/\partial T)\} \quad (26)$$

Therefore, for correcting the temperature dependency at the zero point, the value should be set as follows:

$$\alpha = \partial Vof/\partial T \quad (27)$$

At the input section of the operational amplifier 8 in FIG. 3, when the currents of the current sources 21 and 22 are set to zero, the current of the current source 19 is set to Io, the emitter current of the NPN transistor 17 is set to IE17, the emitter current of the NPN transistor 18 is set to IE18, and so the following relationship will arise:

$$IE17 = IE18 = \tfrac{1}{2}\cdot Io \quad (28)$$

when the emitter area of the NPN transistors 17 and 18 are equal to each other and the current amplifying rate is sufficiently large. Therefore, if the emitter currents of the PNP transistors 15 and 16 are represented by IS15 and IS16 respectively, the following relationship would arise:

$$IE15 = IE16 = \tfrac{1}{2}\cdot Io \quad (29)$$

The emitters of the PNP transistors 15 and 16 are coupled in common, and the relationship between a base-emitter voltage BE and an emitter current IE of a transistor can be generally expressed as follows:

$$VBE = (kT/q)\cdot\log(IE/IS) \quad (30)$$

where q is electron charge; k, is Boltzmann's constant and Is is the saturation current of the transistor. When the equation (30) is applied to the transistors 15 and 16, $$VBE15 = (kT/q)\cdot\log(IE15/IS15) \quad (31)$$

$$VBE16 = (kT/q)\cdot\log(IE16/IS16) \quad (32)$$

where VBE represents a base-emitter voltage of the PNP transistor 15, VBE represents a base-emitter voltage of the PNP transistor 16, IS15 and IS16 represent saturation currents of the PNP transistors 15 and 16 respectively. Here, the offset voltage Vol of the operational amplifier 8 can be expressed as follows:

$$Vof = VBE16 - VBE15 \quad (33)$$

Therefore, from the equations (31) and (32), the following relationship can be derived:

$$Vof = (kT/q)\cdot\log\{(IS15/IS16)\cdot(IE16/IE15)\} \quad (34)$$

Since IS15 = IS16 if both transistors 15 and 16 are identical to each other, $$Vof = (kT/q)\cdot\log(IE16/IE15) \quad (35)$$

Therefore, from the equation (29), Vof = 0 if IE16 = IE15.

If the current of the current source 22 is represented by If, IE17 = IE18 because of the same emitter current of the NPN transistors 17 and 18. Also, the emitter currents of the PNP transistors 15 and 16 would become IE15 + IE16 = Io. The collector current IC15 of the PNP transistor 15 would be IC15 = IE17. The collector current IC16 of the PNP transistor 16 would become IC16 = IE18 + If. From the relationship of IE15 = IC15, IE16 = IC16

$$IE15 = (\tfrac{1}{2})\cdot(Io - If) \quad (36)$$

$$IE16 = (\tfrac{1}{2})\cdot(Io - If) \quad (37)$$

When the equations (36) and (37) are substituted for the equation (35), $$Vof = (kT/q)\cdot\log\{(Io+If)/(Io-If)\} = (kT/q)\cdot\log[1+\{2If/(Io-If)\}] \quad (38)$$

Since the temperature dependencies of Io and If cancel each other when they have no or equal temperature dependency, $$\partial Vof/\partial T = (k/q)\cdot\log[+\{2If/(Io-If)\}] \quad (39)$$

Therefore, from the equations (5) and (27), the value If should be set as follows:

$$\alpha = (k/q)\cdot\log[1 + \{2If/(Io - If)\}] \quad (40)$$

where $$\alpha = Vofdrift/(T2 - T1) \quad (41)$$

$$If = Io\left\{\frac{\exp\left(\frac{Vofdrift}{T_2-T_1}\cdot\frac{q}{k}\right)-1}{\exp\left(\frac{Vofdrift}{T_2-T_1}\cdot\frac{q}{k}\right)+1}\right\} = Io\tanh\left(\frac{1}{2}\cdot\frac{Vofdrift}{T_2-T_1}\cdot\frac{q}{k}\right) \quad (42)$$

For example, it is assumed that Io = 10 μA, Vofdrift = 5 mV, T2−T1 = 130° C., If = 2.2 μA, and If = 4.2 μA when Vofdrift = 10 mV.

In FIG. 4, variable resistors 25 and 28 for setting the value If are shown. In practice, to form these variable resistors on a semiconductor sensor chip, the resistors are formed on the chip together with the operational amplifiers 8 and 9 using a thin film made of NiCr etc, and thereafter the resistance values of the resistors are adjusted by using a laser etc. For setting the value If = 0, the resistor 25 or 38 is severed to be an open circuit.

If the potential of the power source 29 is represented by Vcc and the resistance value of the resistor 28 is represented by R28, then $$If = (Vcc - VBE27)/R28 \quad (43)$$

where VBE27 represents a base-emitter voltage of the NPN transistor 27. As can be seen from the equation (43), the value If depends on VBE27, and the value R28 is uniquely determined. Therefore, the temperature dependencies cancel each other when the current Io of the current source 19 is equal to that of the current source 22 or 21, thereby providing a constant value of $\partial Vof/\partial T$ in the equation (39).

The adjustment of If is carried out by measuring it with reference to a previously measured Voldrift in the bridge circuit 1, or by measuring an offset voltage Vof of the operational amplifier 8 (in view of the equation (38), Vol depends on If).

The current source 21 is used for providing opposite temperature characteristics to that of the current source 22. The selection of which of the current sources 21 or 22 should be used is determined on the basis of the polarity of the temperature characteristics of the bridge circuit.

Figure 5:
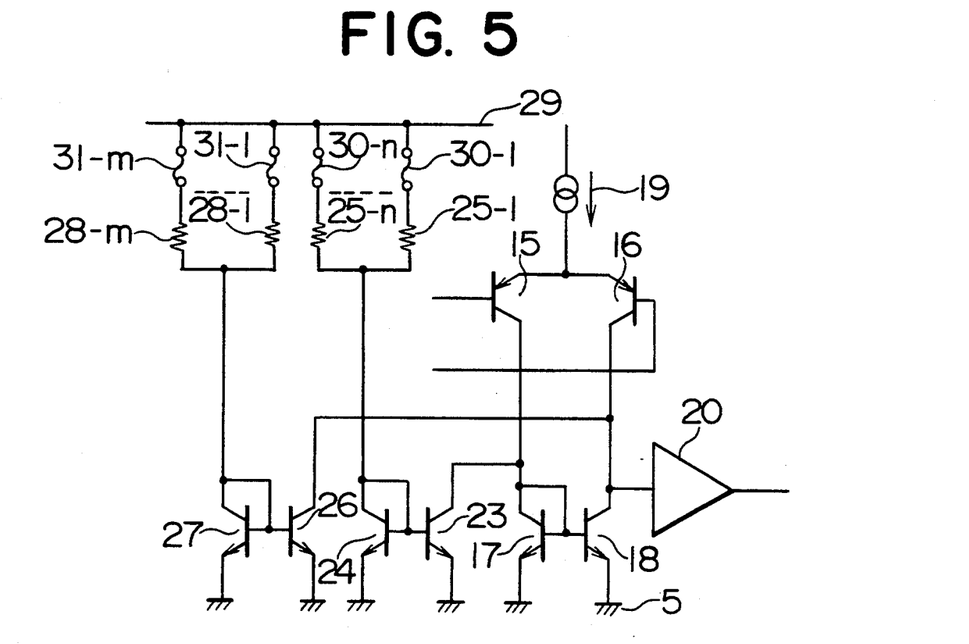
FIG. 5 is a circuit diagram showing a second embodiment of the differential bias current controlling section of FIG. 3.

With reference to FIG. 4, it has been described that variable resistors 25 and 28 are shown as resistors for adjusting If, are formed on the chip and the resistance values of which are adjusted to a desired value by using a laser etc. as mentioned above. In FIG. 5, in a second embodiment, there are n sets arranged in parallel, each set comprising a resistor 25-1 and a fuse 30-1 formed of aluminum (Al), serially connected. Namely, there are resistors 25-1 . . . 25-n and fuses 30-1 . . . 30-n. In the same manner, there are m sets arranged in parallel, each set comprising a resistor 28-1 and a fuse 31-1 which are serially connected, i.e., as resistors 28-1 . . . 28-m and fuses 31-1 . . . 31-m as shown. The value of If is set by cutting the fuses 30-1 . . . 30-n and 31-1 . . . 31-m by a welding means such as a laser to change the resistance value. In this case, the resistors 25-1 . . . 25-n and 28-1 . . . 28-m can be made by impurity diffusion, and the resistance values thereof can be equal to or different from each other. Further, the n and m can be the same value.

In this embodiment, the value Vofdrift of the bridge circuit 1 is previously measured, and the fuses 30-1 . . . 30-n and 31-1 . . . 31-m are cut to have resistance values in accordance with the Vofdrift respectively. For setting If to zero, all fuses 30-1 . . . 30-n and 31-1 . . . 31-m should be cut.

Figure 6:
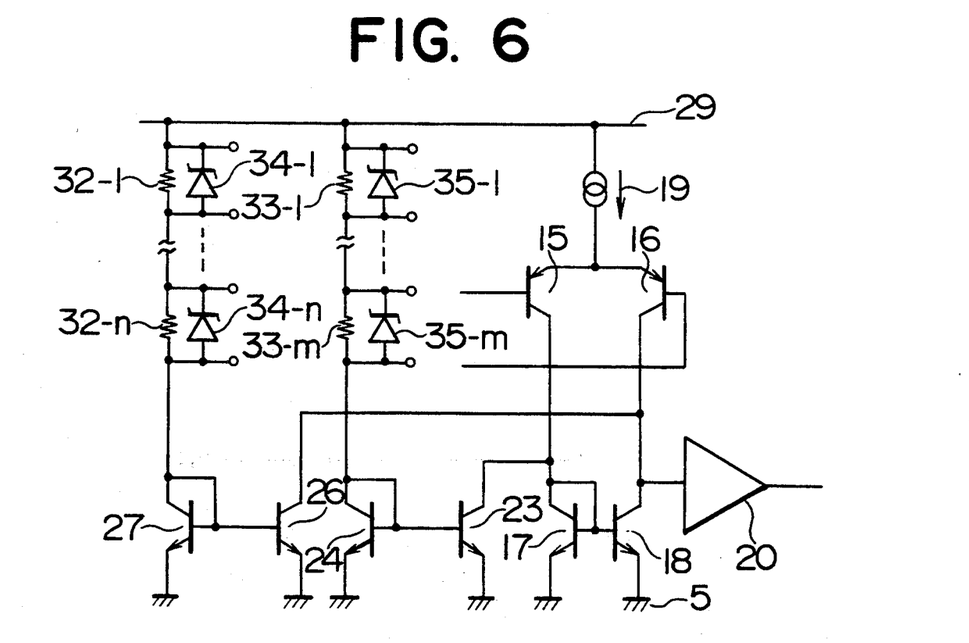
FIG. 6 is a circuit diagram showing a third embodiment of the differential bias current controlling section of FIG. 3.

FIG. 6 shows a third embodiment of the present invention. In this embodiment, there are provided serially connected resistors 32-1 . . . 32-n and 33-1 . . . 33-m, to which Zener diodes 34-1 . . . 34-n and 35-1 . . . 35-m are respectively connected in parallel. The anode and the cathode are probed to cause a large current (typically several 10 mA–several 100 mA) to flow from the cathode to the anode, and the value If can be adjusted by short-circuiting the selected Zener diode. Likewise, n and m can be the same value.

In this embodiment, the value Vofdrift of the bridge circuit 1 is previously measured, and a proper one is selected from the Zener diodes 34-1 . . . 34-n and 35-1 . . . 35-m to be short-circuited by a current flow. In this embodiment, since it is difficult to set If to zero, the collector currents of the transistors 26 and 23 should be equal to provide a nominally same state such as If being zero. Namely, in this embodiment, the difference between the transistors 26 and 23 is set as the value If.

Figure 7:
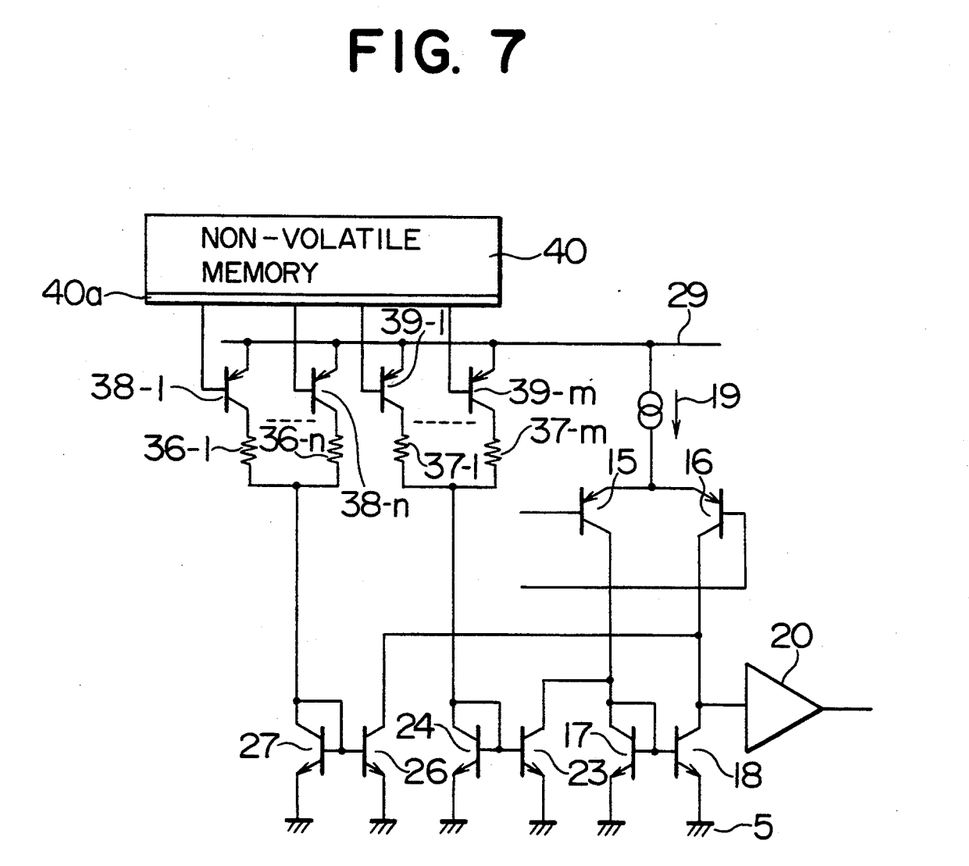
FIG. 7 is a circuit diagram showing a fourth embodiment of the differential bias current controlling section of FIG. 3.

FIG. 7 shows a fourth embodiment of the present invention. In this embodiment:, there is provided a non-volatile memory 40 for controlling the resistors 36-1 . . . 36-n and 37-1 . . . 37-m, PNP transistors 38-1 . . . 38-n and 39-1 . . . 39-m serially connected to the resistors respectively, and PNP transistors 38-1 . . . 38-n and 39-1 . . . 39-m. As the non-volatile memory 40, any of an EEPROM, flash EPROM, OTPROM or fuse ROM can be used, and it is provided with a buffer 40a. N and m can be the same value.

In this embodiment, the value Vofdrift of the bridge circuit 1 is previously measured, and data are stored in the non-volatile memory 40 such that the value If is set in accordance with Vofdrift and that a proper one among the PNP transistors 38-1 . . . 38-n and 39-1 . . . 39-m is turned on. For setting If to zero, all the PNP transistors 38-1 . . . 38-n and 39-1 . . . 39-m should be turned off.

Figure 8:
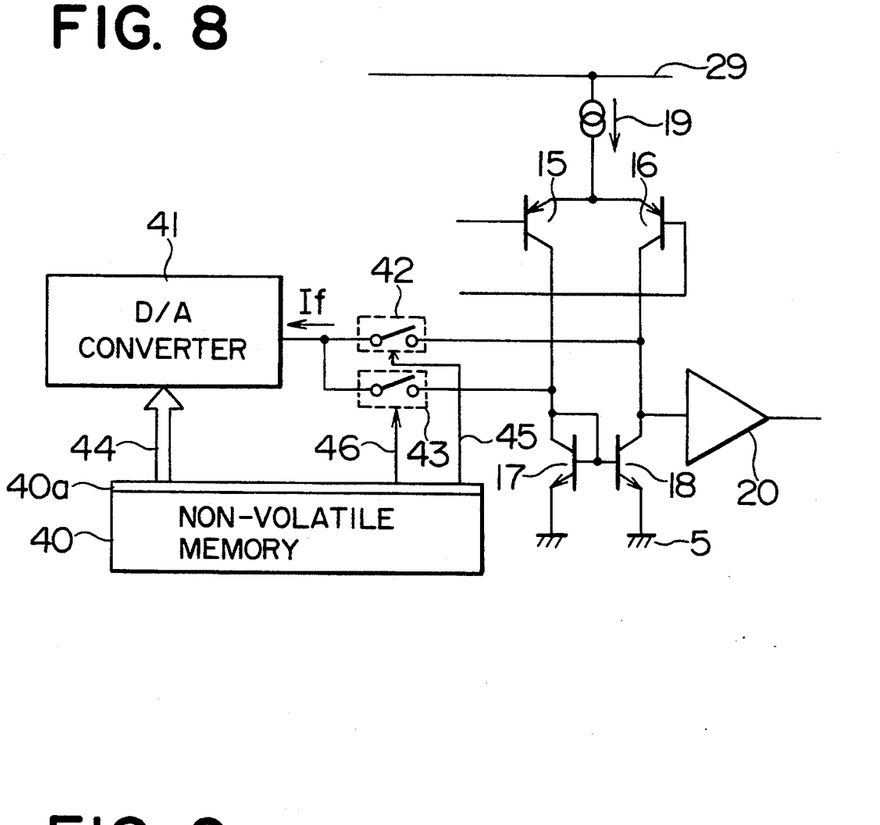
FIG. 8 is a circuit diagram showing a fifth embodiment of the differential bias current controlling section of FIG. 3.

FIG. 8 shows a fifth embodiment. In this embodiment, there are provided a D/A converter 41 as a current output for absorbing current, current switches 42 and 43, and a non-volatile memory 40. The current value absorbed by the D/A converter 41 and the on-off operation of the current switches 42 and 43 are controlled by signals transmitted from the non-volatile memory 40 through data bus 44 and data lines 45 and 46.

In this embodiment, Vofdrift of the bridge circuit 1 is previously measured, and data are stored in the non-volatile memory 40 such that the output current If in the D/A converter becomes a proper value. Simultaneously, data are stored in the non-volatile memory 40 such that the current switches 42 and 43 are suitably selected and turned on in accordance with the polarity of Vofdrift. On the basis of the data from the non-volatile memory 40, the D/A converter 41 and the current switches 42 and 43 are controlled. In this case, if both the current switches 42 and 43 are turned off, the value If becomes zero.

Figure 9:
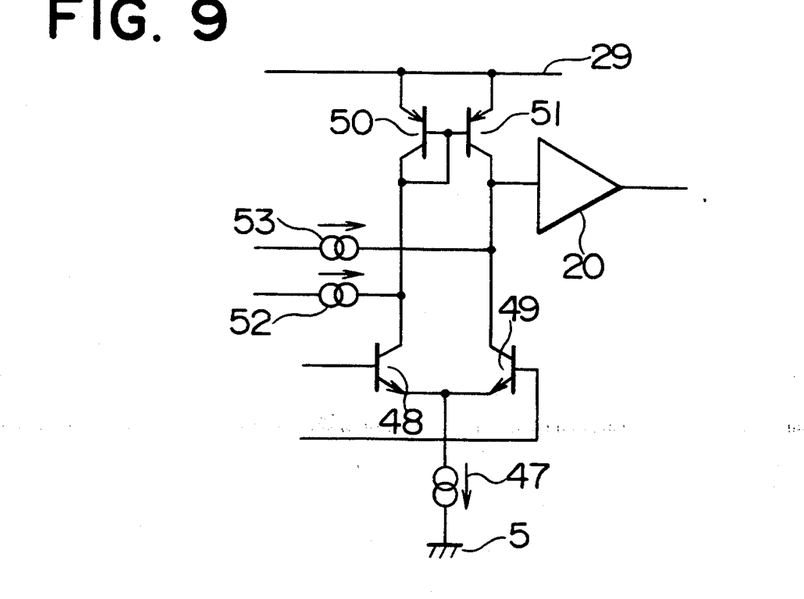
FIG. 9 is a circuit diagram showing a sixth embodiment of the present invention which is another example of parts of the signal processing circuit of FIG. 2.

FIG. 9 shows a sixth embodiment. While PNP transistors 15 and 16 have been used at the input section of the operational amplifier 8 in the aforementioned embodiments, an absorbing-type current source 47 is used instead of the discharging-type current source 19 and in the same manner NPN transistors 48 and 49 instead of PNP transistors 15 and 16, PNP transistors 50 and 51 instead of NPN transistors 17 and 18, and discharging-type current sources 52 and 53 instead of absorbing type current sources 21 and 22, are used respectively. This embodiment can provide the same effect as the aforementioned embodiments.

As mentioned above, according to the present invention, an intentional difference is given to the emitter currents of two transistors of a differential amplifier using two sets of transistors, so as to compensate for the temperature dependency of the zero point output voltage of a bridge circuit of a pressure detector by utilizing the temperature dependency of the base-emitter voltage difference of the two transistors. As a result, the device can be easily integrated to provide an inexpensive pressure detecting circuit for a semiconductor pressure sensor, and a semiconductor pressure sensor. In addition, it becomes possible to perform more accurate temperature compensation so as to achieve a semiconductor pressure sensor with high accuracy.

What is claimed is:

1. A pressure detecting circuit having a temperature-compensating function comprising:

pressure detecting means including four gauge resistors coupled in a bridge circuit for generating a voltage difference between diagonally opposite terminals of the bridge circuit in response to a voltage applied to the bridge circuit and a stress applied to the resistors, the voltage difference when no stress is applied to the resistors being the zero point output voltage; and signal processing means including a differential amplifier having two transistors coupled to the bridge circuit for amplifying the voltage difference and producing a voltage signal, each transistor having an emitter, a collector, and a base; a differential bias current control circuit including two current sources coupled to the respective collectors of the transistors of said differential amplifier for generating a voltage difference between base-emitter voltages of the transistors, wherein each of said current sources includes a variable resistor for adjusting emitter current flowing in the respective transistors of said differential amplifier, said differential bias current control circuit thereby providing an input offset voltage at the differential amplifier that varies with temperature; and a power amplifier for amplifying the voltage signal wherein variation of the zero point output voltage of the pressure detecting means with temperature is compensated by variation with temperature of the input offset voltage generated by the differential amplifier.

2. A pressure detecting circuit having a temperature-compensating function comprising:

pressure detecting means including four gauge resistors coupled in a bridge circuit for generating a voltage difference between diagonally opposite terminals of the bridge circuit in response to voltage applied to the bridge circuit and a stress applied to the resistors, the voltage differences when no stress is applied to the resistors being the zero point output voltage; and signal processing means including a differential amplifier having two transistors coupled to the bridge circuit for amplifying the voltage difference and producing a voltage signal, each transistor having an emitter, a collector, and a base; a differential bias current control circuit including two current sources coupled to the respective collectors of the transistors of said differential amplifier for generating a voltage difference between base-emitter voltages of the transistors wherein each of said current sources includes a variable resistance including a plurality of serial circuits of fuses and resistors for providing varying resistances, said differential bias current control circuit thereby providing an input offset voltage at the differential amplifier that varies with temperature; and a power amplifier for amplifying the voltage signal wherein variation of the zero point output voltage of the pressure detecting means With temperature is compensated by variation with temperature of the input offset voltage generated by the differential amplifier.

3. A pressure detecting circuit having a temperature-compensating function comprising:

pressure detecting means including four gauge resistors coupled in a bridge circuit for generating a voltage difference between diagonally opposite terminals of the bridge circuit in response to a voltage applied to the bridge circuit and a stress applied to the resistors, the voltage difference when no stress is applied to the resistors being the zero point output voltage; and signal processing means including a differential amplifier having two transistors coupled to the bridge circuit for amplifying the voltage difference and producing a voltage signal, each transistor having an emitter, a collector, and a base; a differential bias current control circuit including two current sources coupled to the respective collectors of the transistors of said differential amplifier for generating a voltage difference between base-emitter voltages of the transistors wherein each of said current sources includes a variable resistance including a plurality of parallel circuits, each parallel circuit including a Zener diode and a resistor, said differential bias current control circuit thereby providing an input offset voltage at the differential amplifier that varies with temperature; and a power amplifier for amplifying the voltage signal wherein variation of the zero point output voltage of the pressure detecting means with temperature is compensated by variation with temperature of the input offset voltage generated by the differential amplifier.

4. A pressure detecting circuit having a temperature-compensating function comprising:

pressure detecting means including four gauge resistors coupled in a bridge circuit for generating a voltage difference between diagonally opposite terminals of the bridge circuit in response to a voltage applied to the bridge circuit and a stress applied to the resistors, the voltage difference when no stress is applied to the resistors being the zero point output voltage; and signal proccessing means including a differential amplifier having two of transistors coupled to the bridge circuit for amplifying the voltage difference and producing a voltage signal, each transistor having an emitter, a collector, and a base; a differential bias current control circuit including two current sources coupled to the respective collectors of the transistors of said differential amplifier for generating a voltage difference between base-emitter voltages of the transistor wherein each of said current sources includes a plurality of serial circuits, each serial circuit including a biasing transistor and a resistor connected in parallel and a non-volatile memory for controlling each of the biasing transistors, wherein data in accordance with the temperature dependency of the zero point output voltage of said pressure detecting means are stored in said non-volatile memory, for generating a voltage difference between base emitter voltages of the transistors, said differential bias current control circuit thereby providing an input offset voltage at the differential amplifier that varies with temperature; and a power amplifier for amplifying the voltage signal wherein variation of the zero point output voltage of the pressure detecting means with temperature is compensated by variation with temperature of the input offset voltage generated by the differential amplifier.

5. A pressure detecting circuit having a temperature-compensating function comprising:

pressure detecting means including four gauge resistors coupled in a bridge circuit generating a voltage difference between diagonally opposite terminals of the bridge circuit in response to voltage applied to the bridge circuit and a stress applied to the resistors, the voltage difference when no stress is applied to the resistors being the zero point output voltage; and signal processing means including a differential amplifier having two transistors coupled to the bridge circuit for amplifying the voltage difference and producing a voltage signal, each transistor having an emitter, a collector, and a base; a differential bias current control circuit including a digital-to-analog converter receiving emitter currents of the transistors, a current switch for selectively coupling the digital-to-analog converter to the collectors of the transistors of said differential amplifier, and a non-volatile memory for controlling said digital-to-analog converter and said current switch, wherein data in accordance with the temperature dependency of the zero point output voltage of said pressure detecting means are stored in said non-volatile memory, for generating a voltage, difference between base-emitter voltages of the transistors, said differential bias current control circuit thereby providing an input offset voltage at the differential amplifier that varies with temperature; and a power amplifier for amplifying the voltage signal wherein variation of the zero point output voltage of the pressure detecting means with temperature is compensated by variation with temperature of the input offset voltage generated by the differential amplifier.

* * * * *